(12) United States Patent
Seo et al.

(10) Patent No.: US 11,218,150 B2
(45) Date of Patent: Jan. 4, 2022

(54) ELECTRONIC CIRCUIT AND ELECTRONIC APPARATUS

(71) Applicant: SONY SEMICONDUCTOR SOLUTIONS CORPORATION, Kanagawa (JP)

(72) Inventors: Yuki Seo, Kanagawa (JP); Yoshifumi Miyajima, Kanagawa (JP); Zhiwei Zhou, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/758,675

(22) PCT Filed: Sep. 19, 2018

(86) PCT No.: PCT/JP2018/034580
§ 371 (c)(1),
(2) Date: Apr. 23, 2020

(87) PCT Pub. No.: WO2019/087602
PCT Pub. Date: May 9, 2019

(65) Prior Publication Data
US 2020/0358442 A1 Nov. 12, 2020

(30) Foreign Application Priority Data
Nov. 2, 2017 (JP) .............................. JP2017-212573

(51) Int. Cl.
*H03K 19/0185* (2006.01)
*H03K 17/10* (2006.01)

(52) U.S. Cl.
CPC ....... *H03K 19/0185* (2013.01); *H03K 17/102* (2013.01)

(58) Field of Classification Search
None
See application file for complete search history.

(56) References Cited

U.S. PATENT DOCUMENTS

| 2004/0008197 | A1  | 1/2004 | Miyazaki |
| 2004/0151196 | A1  | 8/2004 | Iwasaki |
| 2018/0005597 | A1* | 1/2018 | Kumar ................... G09G 5/006 |

FOREIGN PATENT DOCUMENTS

| JP | 06-268505 A | 9/1994 |
| JP | 2001-185689 A | 7/2001 |

(Continued)

OTHER PUBLICATIONS

International Search Report and Written Opinion of PCT Application No. PCT/JP2018/034580, dated Dec. 4, 2018, 09 pages of ISRWO.

*Primary Examiner* — Jany Richardson
(74) *Attorney, Agent, or Firm* — Chip Law Group

(57) ABSTRACT

An electronic circuit that includes a plurality of first drivers coupled in parallel, the first drivers each including transistors coupled in series and transmitting data at a predetermined communication speed, and a second driver that includes transistors coupled in series and transmitting data at a communication speed lower than the communication speed of the first driver. The number of first drivers operating in parallel is sufficient for output impedance of the first drivers to meet a predetermined standard through application of an electrical potential to bodies of the transistors of the first drivers. The electrical potential causes an output level of the second driver to meet a predetermined standard.

4 Claims, 6 Drawing Sheets

(56) References Cited

FOREIGN PATENT DOCUMENTS

| | | |
|---|---|---|
| JP | 2004-046595 A | 2/2004 |
| JP | 2004-056546 A | 2/2004 |
| JP | 2011-096950 A | 5/2011 |
| JP | 2017-038212 A | 2/2017 |
| KR | 10-2004-0010288 A | 1/2004 |
| KR | 10-2004-0030230 A | 4/2004 |
| TW | 200401259 A | 1/2004 |

* cited by examiner

[FIG. 1]
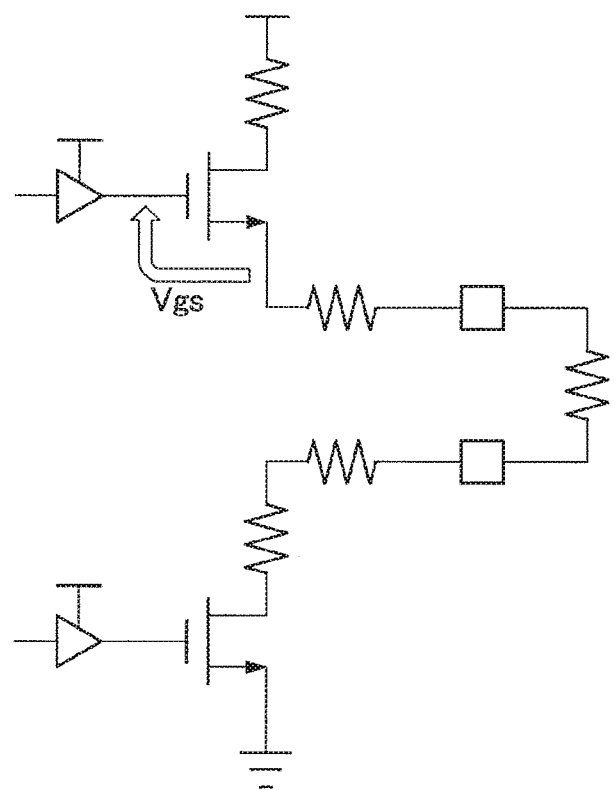

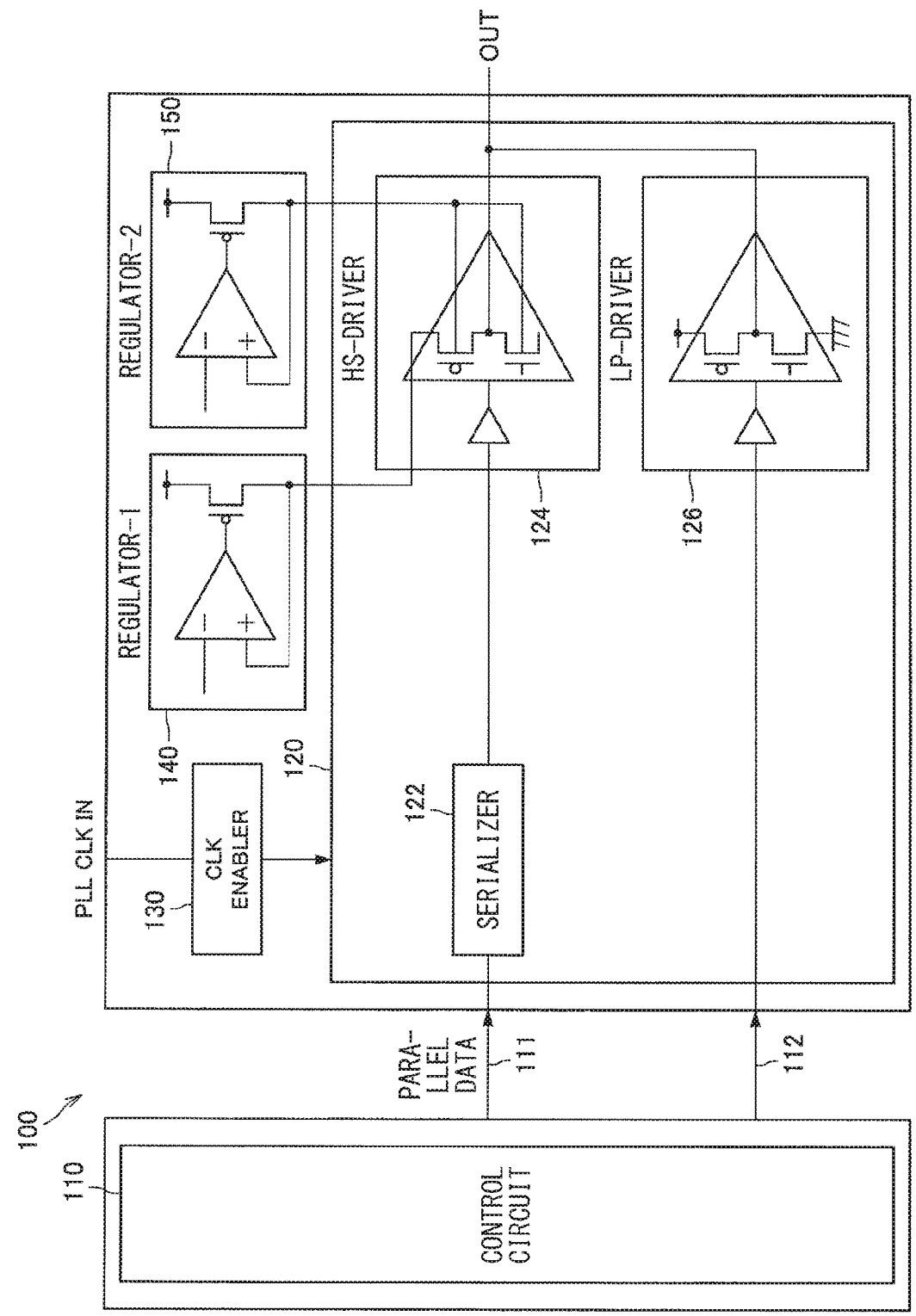
[FIG. 2]

[FIG. 3]
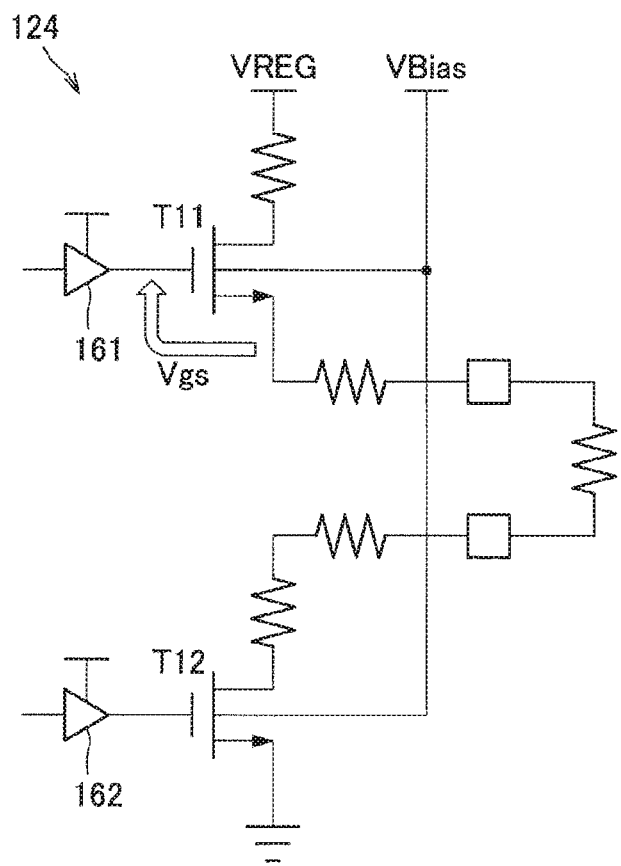
[FIG. 4]
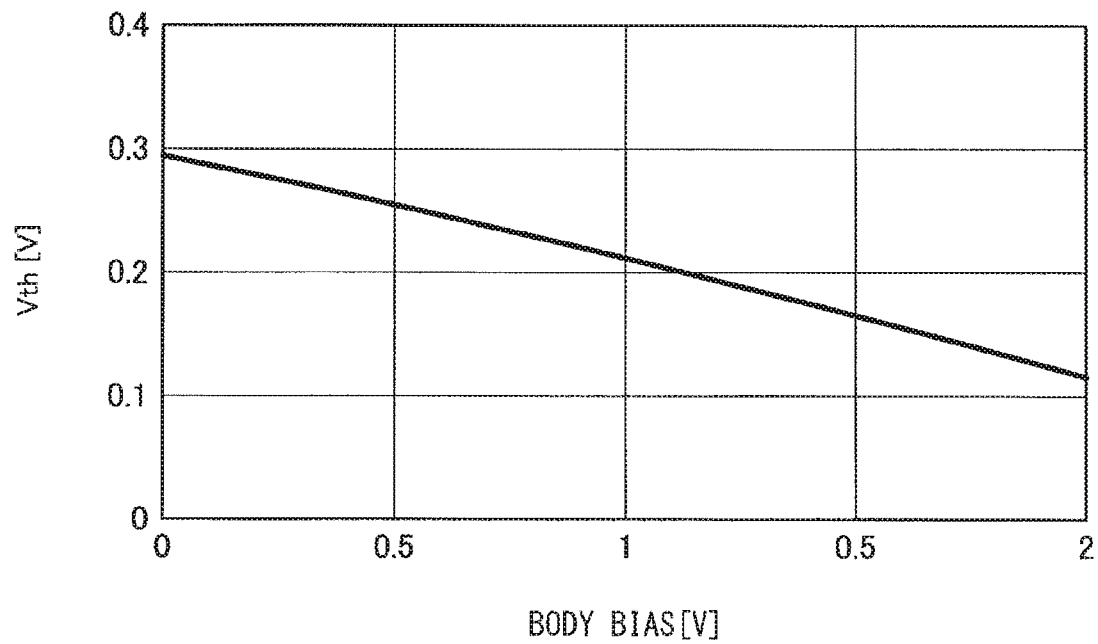

[FIG. 5]
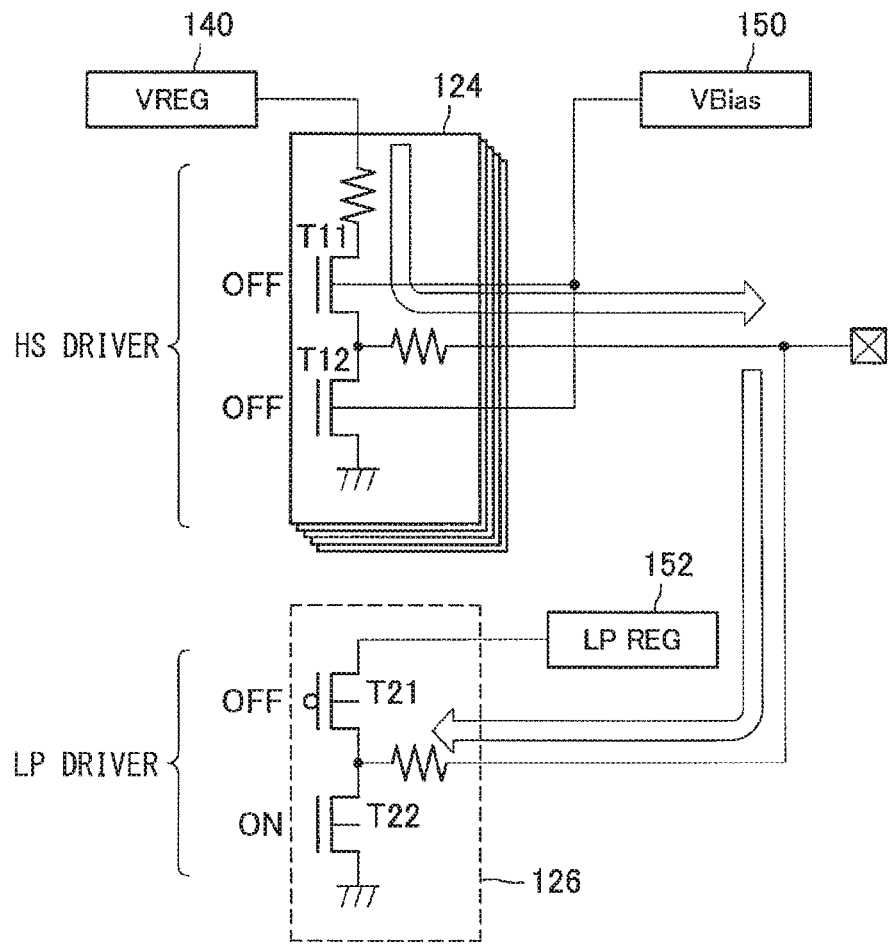
[FIG. 6]
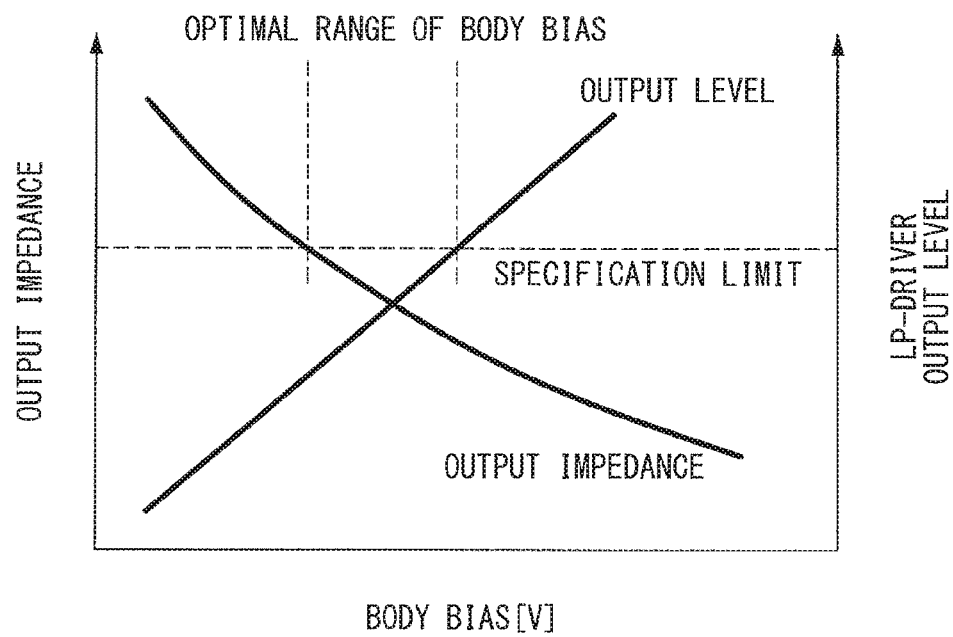

[FIG. 7]
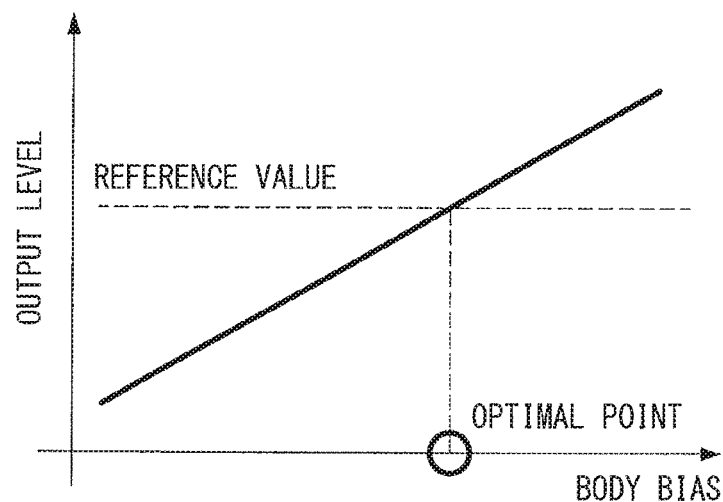
[FIG. 8]
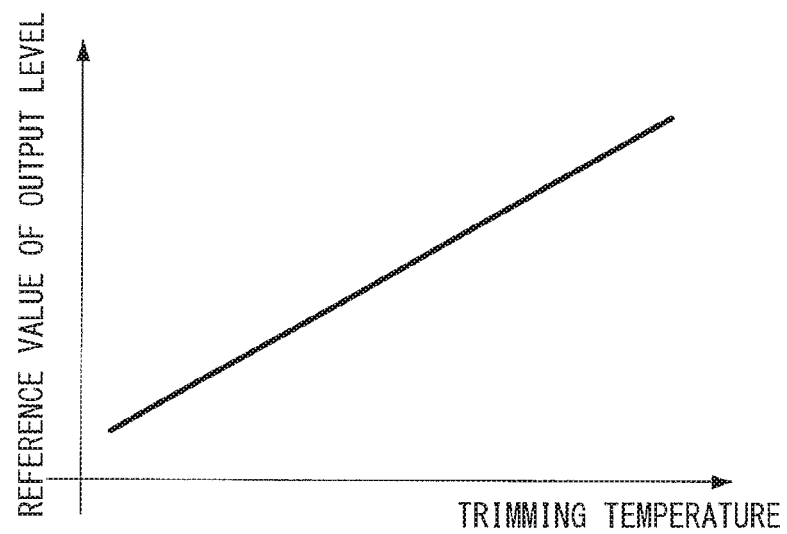

[FIG. 9]
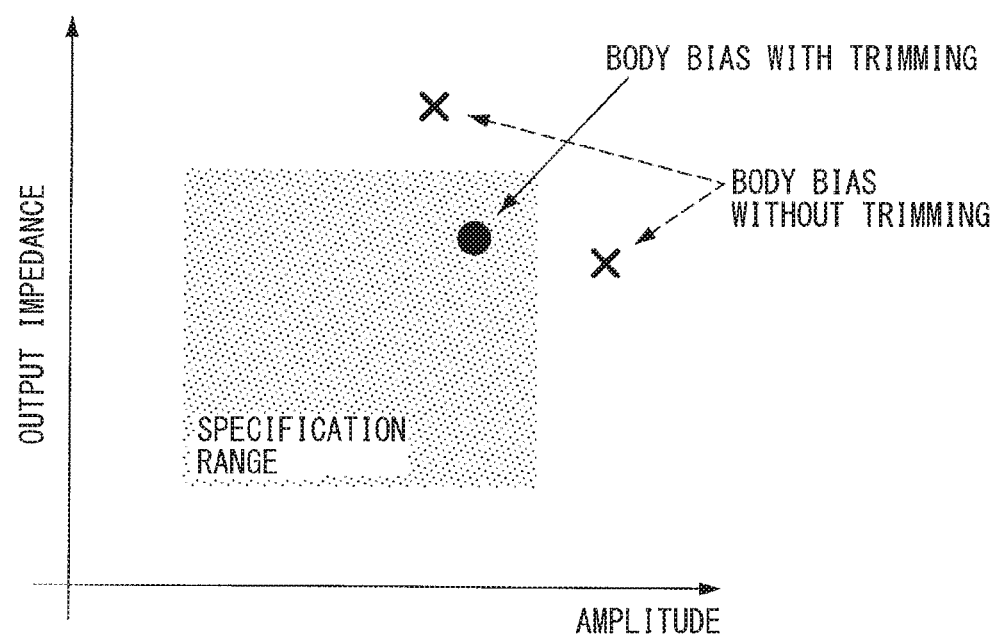

ELECTRONIC CIRCUIT AND ELECTRONIC APPARATUS

CROSS REFERENCE TO RELATED APPLICATIONS

This application is a U.S. National Phase of International Patent Application No. PCT/JP2018/034580 filed on Sep. 19, 2018, which claims priority benefit of Japanese Patent Application No. JP 2017-212573 filed in the Japan Patent Office on Nov. 2, 2017. Each of the above-referenced applications is hereby incorporated herein by reference in its entirety.

TECHNICAL FIELD

The disclosure relates to an electronic circuit and an electronic apparatus.

BACKGROUND ART

In recent years, the sophistication and multifunctionality of an electronic apparatus have been enhanced. Due to such enhancement, various devices, such as semiconductor chips, sensors, and display devices, have been mounted on the electronic apparatuses. A large amount of data is exchanged between such devices. The amount of the data has been increasing with the enhancement of the sophistication and multifunctionality of the electronic apparatuses. Therefore, data is often exchanged using a high-speed interface capable of transmission and reception of data at, for example, several Gbps. A document that discloses a technique using such a high-speed interface includes, for example, PTL 1.

CITATION LIST

Patent Literature

PTL 1 Japanese Unexamined Patent Application Publication No. 2017-038212

SUMMARY OF THE INVENTION

Technical Problem

The mobile industry processor interface (MIPI) Alliance, for example, has established standards for interfaces interconnecting devices in electronic apparatuses. An interface complying with such a standard is provided with drivers for performing high-speed communication and low-speed communication. A decrease in the voltage of the driver for high-speed communication has affected the output level of the driver for low-speed communication.

Therefore, the disclosure proposes a novel and modified electronic circuit and an electronic apparatus that are able to avoid the influence on the output level of the driver for low-speed communication due to a decrease in the voltage of the driver for high-speed communication in an interface for interconnection of devices in the electronic apparatus.

Solution to Problem

According to the disclosure, an electronic circuit is provided that includes a plurality of first drivers coupled in parallel, the first drivers each including transistors coupled in series and transmitting data at a predetermined communication speed; and a second driver including transistors coupled in series and transmitting data at a communication speed lower than the communication speed of the first drivers, in which the number of first drivers operating in parallel is sufficient for output impedance of the first drivers to meet a predetermined standard through application of an electrical potential to bodies of the transistors of the first drivers, the electrical potential causing an output level of the second driver to meet a predetermined standard.

Additionally, according to the disclosure, an electronic apparatus that includes the above-described electronic circuit is provided.

Effect of the Invention

According to the disclosure described above, a novel and modified electronic circuit and an electronic apparatus are provided that are able to avoid an influence on an output level of the driver for low-speed communication due to a decrease in the voltage of the driver for high-speed communication in an interface for interconnection of devices in the electronic apparatus.

Noted that the above effects are not necessarily limited, and any of the effects described in the specification or other effects that can be understood from the specification may be provided together with or in place of the above effects.

BRIEF DESCRIPTION OF THE DRAWINGS

FIG. 1 is an explanatory diagram illustrating a circuit configuration example of an HS driver.

FIG. 2 is an explanatory diagram illustrating a configuration example of an electronic apparatus including an interface according to an embodiment of the disclosure.

FIG. 3 is an explanatory diagram illustrating a circuit configuration example of an HS driver 124 according to an embodiment of the disclosure.

FIG. 4 is an explanatory diagram illustrating, in a graph, an example relation between a body bias voltage applied to the body of a MOSFET and a threshold voltage Vth.

FIG. 5 is an explanatory diagram illustrating the influence of a leakage current from an HS driver.

FIG. 6 is an explanatory diagram illustrating an example of the relation between the body bias voltage, the output impedance of an HS driver, and the output level of an LP driver.

FIG. 7 is an explanatory diagram illustrating, in a graph, an example relation between the body bias voltage and the output impedance of an LP driver.

FIG. 8 is an explanatory diagram illustrating, in a graph, an example of a relation between the reference value of the output level of an LP driver and the temperature at the time of trimming.

FIG. 9 is an explanatory diagram illustrating a graph plotting the simulated results of a case in which the body bias voltage is not trimmed and a case in which the body bias voltage is trimmed.

DESCRIPTION OF THE EMBODIMENTS

Preferred embodiments of the disclosure will now be described in detail with reference to the accompanying drawings. Throughout the specification and the drawings, elements having substantially the same functional configuration are denoted with the same numerals to avoid any redundant description.

Note that the description will be provided in the following order:

1. Embodiment of Disclosure
1.1. Overview
1.2. Configuration Example and Operation Example
2. Conclusion 1. Embodiment of Disclosure

[1.1. Overview]

The overview of an embodiment of the disclosure will be described below before describing the embodiment of the disclosure in detail.

As described above, the sophistication and multifunctionality of electronic apparatuses have been enhanced. Due to such enhancement, various devices, such as semiconductor chips, sensors, and display devices, have been mounted on the electronic apparatuses. A large amount of data is exchanged between such devices. The amount of the data has been increasing with the enhancement of the sophistication and multifunctionality of the electronic apparatuses. Therefore, data is often exchanged using a high-speed interface capable of transmission and reception of data at, for example, several Gbps.

The MIPI Alliance, for example, has established standards for interfaces interconnecting devices in an electronic apparatus. Such standards include MIPI C-PHY and MIPI D-PHY.

An interface complying with such a standard is provided with drivers for respectively performing high-speed communication and low-speed communication. The driver for high-speed communication is referred to as a high-speed (HS) driver, and the driver for low-speed communication is referred to as a low-power (LP) driver.

A decrease in the voltage of the HS driver conforming to standards such as MIPI C-PHY and MIPI D-PHY leads to a decrease in the gate-source potential of an MOSFET of the HS driver, and thereby causes a significant increase in the output impedance. FIG. 1 is an explanatory diagram illustrating a circuit configuration example of the HS driver.

The output impedance of the HS driver is inversely proportional to the gate-source potential Vgs of the MOSFET. The MOSFET is driven by a buffer coupled to the gate, and the gate potential during operation is the power supply voltage. Moreover, the source potential is determined by the amplitude voltage. However, the designer is not able to freely determine the amplitude because the amplitude is specified by the standards.

Therefore, a decrease in the voltage of the HS driver leads to a decrease in the gate-source potential, and thereby to an increase in the output impedance. Therefore, the decrease in the voltage of the HS driver may cause the output impedance of the HS driver not to meet the specification.

The HS driver is coupled to the LP driver via an output terminal, as described below. A leakage current from the HS driver may impair the output level of the LP driver. Therefore, the decrease in the voltage of the HS driver may cause the output level of the LP driver not to meet the specification.

Even when the voltage of the HS driver is decreased so as to comply with standards such as MIPI C-PHY and MIPI D-PHY as described above, it is important to meet specifications for both the output impedance of the HS driver and the output level of the LP driver.

In view of the above issues, the disclosing party has diligently studied the technology for complying with the standards used for interfaces interconnecting devices in an electronic apparatus. As a result, the disclosing party has conceived a technique for complying with standards used for interfaces interconnecting devices in an electronic apparatus, as described below.

The overview of the embodiment of the disclosure has been described above. Details of the embodiment of the disclosure will now be described.

[1.2. Configuration Example and Operation Example]

FIG. 2 is an explanatory diagram illustrating a configuration example of an electronic apparatus including an interface according to an embodiment of the disclosure. A configuration example of the electronic apparatus including an interface according to an embodiment of the disclosure will now be described with reference to FIG. 2.

As illustrated in FIG. 2, an electronic apparatus 100 according to an embodiment of the disclosure includes a control circuit 110, a driver unit 120, a clock control circuit 130, and regulators 140 and 150. The driver unit 120 includes a serializer 122, HS drivers 124, and an LP driver 126.

The control circuit 110 receives data from the components of the electronic apparatus 100 and outputs data and control signals to the components. In this embodiment, the control circuit 110 is coupled to a signal line 111 and a signal line 112. The signal line 111 is for high-speed transmission of data from the control circuit 110. The signal line 112 is for low-speed transmission of data from the control circuit 110. In the description below, the mode in which data is transmitted at high speed is referred to as a high-speed mode, and the mode in which data is transmitted at low speed is referred to as a low-speed mode.

The serializer 122 is a circuit that converts a parallel signal sent from the control circuit 110 via the signal line 111 to a single serial signal. The serializer 122 outputs the serial signal to the HS drivers 124.

The HS drivers 124 are circuits each outputting a signal at high speed in the high-speed mode. The HS drivers 124 are fed power from the regulator 140. Furthermore, the body of the MOSFET of each of the HS drivers 124 is fed a body bias voltage from the regulator 150. The plurality of HS drivers 124 are disposed in parallel. Each of the HS drivers 124 is also referred to as a unit.

The LP driver 126 is a circuit that outputs a signal at low speed in the low-speed mode. The output terminal of the LP driver 126 is coupled to the output terminal of the HS driver 124. The HS driver 124 and the LP driver 126 are both drives that output signals complying with data communication in accordance with a predetermined standard, such as the MIPI C-PHY or the MIPI D-PHY.

The clock control circuit 130 is a circuit that switches between an output state and a stopped state. In the output state, the clock control circuit 130 outputs an inputted phase locked loop (PLL) clock to the driver unit 120. In the stopped state, the clock control circuit 130 does not output the clock to the driver unit 120.

The regulator 140 is a circuit that feeds power to the HS driver 124. The regulator 150 is a circuit that feeds a body bias voltage to the body of the MOSFET of the HS driver 124.

The effects of feeding a body bias voltage from the regulator 150 to the body of the MOSFET of the HS driver 124 will now be described.

FIG. 3 is an explanatory diagram illustrating a circuit configuration example of an HS driver 124 according to an embodiment of the disclosure. As illustrated in FIG. 3, the HS driver 124 includes amplifiers 161 and 162 and MOSFETs T11 and T12. The MOSFET T11 receives a voltage VREG from the regulator 140.

The bodies of the MOSFETs T11 and T12 each receives a body bias voltage VBias from the regulator 150. The body bias voltage VBias fed from the regulator 150 causes a variation in a threshold voltage Vth of the MOSFETs T11 and T12.

FIG. 4 is an explanatory diagram illustrating, in a graph, an example relation between the body bias voltage applied to the body of a MOSFET and the threshold voltage Vth. As illustrated in FIG. 4, an increase in the body bias voltage causes a decrease in the threshold voltage Vth of the MOSFET.

It is possible to represent the output impedance Zout of the MOSFET T11 by the following expression, where Vgs is the gate-source potential.

$$Z_{out} \propto \frac{1}{V_{gs} - V_{th}} \quad \text{[Expression 1]}$$

A decrease in the power supply voltage causes a significant decrease in the gate-source potential Vgs of the MOSFET T11. The decrease in the gate-source potential Vgs causes an increase in the output impedance Zout, as defined by the expression above. Thus, the decrease in the power supply voltage causes the increase in the output impedance Zout, and the HS driver 124 does not meet the required specification.

Now, the threshold voltage Vth of the MOSFET may be varied by controlling the value of the body bias voltage. It is thereby possible to control the output impedance of the HS driver 124. That is, it is possible to decrease the output impedance Zout by decreasing the threshold voltage Vth.

In contrast, a decrease in the threshold voltage Vth of the MOSFET causes an increase in the leakage current from the MOSFET T11. As described above, the output terminal of the HS driver 124 and the output terminal of the LP driver 126 are coupled. Thus, the leakage current from the HS driver 124 flows into the LP driver 126. The leakage current from the HS driver 124 leads to an increase in the output potential level of the low side of the LP driver 126.

FIG. 5 is an explanatory diagram illustrating the influence of a leakage current from the HS driver 124. The LP driver 126 includes MOSFETs T21 and T22. When the MOSFET T21 is turned off, the desired output potential level of the LP driver 126 is 0 V. However, the leakage current from the HS driver 124 causes the output potential level of the LP driver 126 to exceed the desired output potential level. In other words, a large leakage current from the HS driver 124 hinders the LP driver from meeting the specification of the output potential level.

That is, the adjustment of the output impedance of the HS driver and the increase in the leakage current are in a trade-off relation. For this reason, there is a need to set the body bias voltage VBias to an optimal value. FIG. 6 is an explanatory diagram illustrating an example relation of the body bias voltage VBias to the output impedance of the HS driver and the output level of the LP driver. There is a need to set the body bias voltage VBias so that the output impedance of the HS driver and the output level of the LP driver both do not exceed the specification limits.

However, the resistances of the HS driver and the LP driver and the characteristics of the MOSFETs vary depending on the process. That is, it is possible that an optimal body bias voltage under a certain condition may not necessarily be an optimal value under another condition.

Thus, in this embodiment, the body bias voltage is trimmed. The embodiment is characterized in that, by trimming the body bias voltage, the output impedance of the HS driver and the output level of the LP driver both meet the specification.

In this embodiment, the body bias voltage VBias is set while the HS driver 124 is turned off. At this time, the body bias voltage VBias is set so that the output level of the LP driver 126, which varies in accordance with the leakage current from the HS driver 124, becomes lower than or equal to a reference value. At this time, the body bias voltage VBias is set so that the output level of the LP driver 126 becomes lower than or equal to the reference value while the MOSFET T21 is turned off.

FIG. 7 is an explanatory diagram illustrating, in a graph, an example relation between the body bias voltage VBias and the output level of the LP driver 126. As illustrated, the body bias voltage VBias and the output level of the LP driver 126 are in a directly proportional relation. Thus, a discrete body bias voltage VBias is determined at which the output level of the LP driver 126 becomes lower than or equal to the reference value. Here, the reference value is an output level value that falls within the specification even under a PVT condition in which the leakage current is maximized, that is, the variation in the output level is maximized.

The reference value varies in accordance with the temperature at the time of trimming. FIG. 8 is an explanatory diagram illustrating, in a graph, an example relation between the reference value of the output level of the LP driver 126 and the temperature at the time of trimming. As illustrated, the reference value of the output level of the LP driver 126 and the temperature at the time of trimming are in a directly proportional relation. Thus, if the temperature of at the time of trimming is determined, a discrete reference value of the output level of the LP driver 126 is determined, and thereby a discrete body bias voltage VBias that is lower than or equal to the reference value of the output level of the LP driver 126 is also determined.

After the body bias voltage VBias that is lower than or equal to the reference value of the output level of the LP driver 126 is determined in this way, the number of HS drivers 124 to be disposed in parallel is selected so that the output impedance of the HS drivers 124 determined by the body bias voltage VBias becomes lower than or equal to the specification limit.

When the threshold voltage of the MOSFET of the HS driver 124 is determined by trimming of the body bias voltage VBias, the resistance per unit is determined. When the resistance per unit is determined, it is possible to determine the number of HS drivers 124 required for the desired output impedance.

In this way, trimming is performed in the following order: First, trimming is performed on the body bias voltage VBias, and then trimming is performed a number time equal to the number of units operating in parallel. It is thereby possible to adjust both the output level of the LP driver 126 and the output impedance of the HS driver 124 so that they meet the specification.

The difference in the output level of the LP driver 126 and the output impedance of the HS driver 124 with and without trimming will now be described. FIG. 9 is an explanatory diagram illustrating a graph plotting the simulation results of a case in which the body bias voltage VBias is not trimmed and a case in which the body bias voltage VBias is trimmed. FIG. 9 illustrates a graph in which the horizontal axis represents the amplitude of the output level of the LP driver 126, and the vertical axis represents the output impedance of the HS driver 124.

As illustrated, when the body bias voltage VBias is not trimmed, it is not possible to make both the output level (amplitude) of the LP driver 126 and the output impedance of the HS driver 124 to fall within the specification range. In contrast, when the body bias voltage VBias is not trimmed, it is possible to make both the output level (amplitude) of the LP driver 126 and the output impedance of the HS driver 124 to fall within the specification range.

2. Conclusion

In the above-described embodiment of the disclosure, by trimming the body bias voltage, it is possible to provide an electronic apparatus 100 that meets the specifications of both the output impedance of the HS driver and the output level of the LP driver.

By trimming the body bias voltage in this way, the electronic apparatus 100 according to an embodiment of the disclosure is able to meet the specifications of both the output impedance of the HS driver and the output level of the LP driver during a low voltage operation.

Preferable embodiments of the disclosure have been described in detail with reference to the accompanying drawings. Note that the technical scope of the disclosure is not limited to the embodiments. It is obvious that a person having ordinary skill in the art of the disclosure would be able to conceive of various variations or modifications within the scope of the technical idea recited in the claims, which are also understood to fall within the technical scope of the disclosure.

The effects described in the specification are mere descriptions or examples and are not limited. That is, the technique according to the disclosure may have other effects, as will be apparent to those having ordinary skill in the art from the description herein, in addition to or in place of the above effects.

Note that the following configuration also falls within the technical scope of the disclosure.

(1) An electronic circuit including:
a plurality of first drivers coupled in parallel, the first drivers each including transistors coupled in series and transmitting data at a predetermined communication speed; and
a second driver including transistors coupled in series and transmitting data at a communication speed lower than the communication speed of the first drivers, in which the number of the first drivers operating in parallel is sufficient for output impedance of the first drivers to meet a predetermined standard through application of an electrical potential to bodies of the transistors of the first drivers, the electrical potential causing an output level of the second driver to meet a predetermined standard.

(2) The electronic circuit according to (1), in which the electric potential is applied when only the transistor of the second driver on a low potential side is turned on.

(3) The electronic circuit according to (1) or (2), in which the first drivers and the second driver transmit signals complying with data communication by MIPI C-PHY.

(4) The electronic circuit according to (1) or (2), in which the first drivers and the second driver transmit signals complying with data communication by MIPI D-PHY.

(5) An electronic apparatus including the electronic circuit according to any one of (1) to (4).

100 electronic apparatus
110 control circuit
111 signal line
112 signal line
120 driver unit
122 serializer
124 HS driver
126 LP driver
130 clock control circuit
140 regulator
150 regulator
161 amplifier
162 amplifier

The invention claimed is:

1. An electronic circuit, comprising:
a plurality of first drivers coupled in parallel, wherein
each first driver of the plurality of first drivers includes a first plurality of transistors coupled in series, and
each first driver of the plurality of first drivers is configured to transmit data at a first communication speed;
a second driver including a second plurality of transistors coupled in series, wherein the second driver is configured to transmit data at a second communication speed lower than the first communication speed; and
circuitry configured to apply an electrical potential to the first plurality of transistors of the plurality of first drivers, wherein
electric potential is applied based on turn on of one transistor of the second plurality of transistors of the second driver,
the one transistor is on a low potential side of the second driver,
the plurality of first drivers has an output impedance of a first value that corresponds to a specific standard based on the application of the electrical potential, and
the second driver has an output level of a second value that corresponds to the specific standard based on the application of the electric potential.

2. The electronic circuit according to claim 1, wherein each of the plurality of first drivers and the second driver is further configured to transmit signals that comply with data communication by a mobile industry processor interface (MIPI) C-PHY.

3. The electronic circuit according to claim 1, wherein each of the plurality of first drivers and the second driver is further configured to transmit signals that comply with data communication by a mobile industry processor interface (MIPI) D-PHY.

4. An electronic apparatus, comprising:
an electronic circuit that includes:
a plurality of first drivers coupled in parallel, wherein
each first driver of the plurality of first drivers includes a first plurality of transistors coupled in series, and
each first driver of the plurality of first drivers is configured to transmit data at a first communication speed;
a second driver including a second plurality of transistors coupled in series, wherein the second driver is configured to transmit data at a second communication speed lower than the first communication speed; and
circuitry configured to apply an electrical potential to the first plurality of transistors of the plurality of first drivers, wherein the electric potential is applied based on turn on of one transistor of the second plurality of transistors of the second driver, the one transistor is on a low potential side of the second driver, the plurality of first drivers has an output impedance of a first value that corresponds to a specific standard based on the application of the electrical potential, and the second driver has an output level of a second value that corresponds to the specific standard based on the application of the electric potential.

\* \* \* \* \*